United States Patent
Yamaguchi et al.

(10) Patent No.: US 11,881,887 B2
(45) Date of Patent: Jan. 23, 2024

(54) FREQUENCY CONVERTER AND WIRELESS DEVICE

(71) Applicant: Fujikura Ltd., Tokyo (JP)

(72) Inventors: Yo Yamaguchi, Sakura (JP); Kiyoshi Kobayashi, Sakura (JP)

(73) Assignee: FUJIKURA LTD., Tokyo (JP)

(*) Notice: Subject to any disclaimer, the term of this patent is extended or adjusted under 35 U.S.C. 154(b) by 23 days.

(21) Appl. No.: 17/632,920

(22) PCT Filed: Jan. 13, 2021

(86) PCT No.: PCT/JP2021/000904
§ 371 (c)(1),
(2) Date: Feb. 4, 2022

(87) PCT Pub. No.: WO2022/153409
PCT Pub. Date: Jul. 21, 2022

(65) Prior Publication Data
US 2023/0163800 A1  May 25, 2023

(51) Int. Cl.
*H04B 1/40* (2015.01)

(52) U.S. Cl.
CPC ...................... *H04B 1/40* (2013.01)

(58) Field of Classification Search
CPC ........ H04B 15/00; H04B 15/04; H04B 15/06; H04B 1/30; H04B 2203/5483; H04B 1/0007; H04B 1/1036; H04B 1/16; H04B 1/28; H04B 1/406; H04B 10/25752; H04B 10/272; H04B 10/697; H04B 17/21; H04B 17/318; H04B 2203/5441; H04B 2203/5479; H04B 2203/5491; H04B 3/54; H04B 7/0695; H04B 7/086; H04B 7/088; H04B 1/0475

USPC .......................................................... 455/73
See application file for complete search history.

(56) References Cited

U.S. PATENT DOCUMENTS

| | | | |
|---|---|---|---|
| 2009/0238206 A1* | 9/2009 | Hamada | H04L 5/143 370/468 |
| 2014/0287707 A1* | 9/2014 | Suzuki | H04B 1/1036 455/258 |

FOREIGN PATENT DOCUMENTS

| | | |
|---|---|---|
| JP | 2006-41678 A | 2/2006 |
| JP | 2013-165335 A | 8/2013 |

OTHER PUBLICATIONS

Rio et al., "Digitally Assisted, Fully Integrated, Wideband Transmitters for High-Speed Millimeter-Wave Wireless Communication Links", Springer International Publishing, 2019, p. 136, cited in Specification (4 pages).

(Continued)

*Primary Examiner* — Ajibola A Akinyemi
(74) *Attorney, Agent, or Firm* — WHDA, LLP

(57) ABSTRACT

A frequency converter up-converts a transmission signal in an intermediate frequency hand into a signal in a wireless frequency hand as a USB or an LSR of a local oscillation signal using the local oscillation signal. When PMhigh−1/2×IFwid≤RFtx≤PMhigh−1/2×CHwid, the frequency converter is configured to satisfy ωLO=PMhigh−1/2×Fwid−IFcent and IFtx=RFtx−ωLO. Alternatively, when PMlow+1/2×IFwid≥RFtx≥PMlow+1/2×CHwid, the frequency converter is configured to satisfy ωLO=PMlow+1/2×IFwid+IFcent and IFtx=ωLO−RFtx.

4 Claims, 1 Drawing Sheet

(56) References Cited

OTHER PUBLICATIONS

International Search Report in Japanese dated Mar. 23, 2021, issued in counterpart International Application No. PCT/JP2021/000904 (2 pages).

* cited by examiner

FREQUENCY CONVERTER AND WIRELESS DEVICE

TECHNICAL FIELD

The present invention relates to a frequency converter and a wireless device.

BACKGROUND ART

A frequency converter disclosed in a non-patent document 1 converts a signal with an intermediate frequency $\omega_{IF}$ to at least one or a wireless signal with a frequency or $\omega_{LO}-\omega_{IF}$ (hereinafter referred to as LSB: Lower Side Band) and a wireless signal with a frequency of $\omega_{LO}+\omega_{IF}$ (hereinafter referred to as USB: Upper Side Band). When this conversion is performed, a local oscillation signal with a frequency of $\omega_{LO}$ is used. After the conversion, the frequency converter not only outputs at least one of LSB and USB, but also a portion of the local oscillation signal is leaked as a leakage signal. In order to suppress this leakage signal, a filter circuit is generally used.

PRIOR ART

Non-Patent Document

[Non-Patent Document 1] David Del Rio, et al., "Digitally Assisted, Fully Integrated, Wideband Transmitters for High-Speed Millimeter-Wave Wireless Communication Links", (Switzerland), Springer International Publishing, 2019, P.136

DISCLOSURE OF INVENTION

Problems to be Solved by the Invention

In order to suppress the leakage signal described above using a filter circuit, it is preferable to have a large difference in frequency (hereinafter referred to as "frequency interval") between USB and the leakage signal or between LSB and the leakage signal. The larger the frequency interval, the more the performance required for the filter circuit can be relaxed. Therefore, it can contribute to the downsizing or cost reduction of devices including filter circuits.

The present invention has been made in consideration of such circumstances, and aims to provide a frequency converter or a wireless device that can relax the performance required for a filter circuit.

Means for Solving the Problems

In order to solve the problems described above, an aspect of the present invention is a frequency converter that up-converts a transmission signal in an intermediate frequency band into a signal in a wireless frequency band as a USB of a local oscillation signal using the local oscillation signal, in which when a width of a frequency band of the transmission signal is CHwid, a center value of the intermediate frequency band of the transmission signal is IFtx, a center value of a pass bandwidth IFwid of the intermediate frequency band is IFcent, a lower limit frequency of the wireless frequency baud is PMlow, and an upper limit frequency of the wireless frequency band is PMhigh, in a case where a center value RFtx of the frequency band of the transmission signal after being up-converted and filtered satisfies PMhigh−1/2×IFwid≤RFtx≤PMhigh−1/2×CHwid, a frequency $\omega_{LO}$ of the local oscillation signal satisfies $\omega_{LO}$=PMhigh−1/2×IFwid−IFcent and IFtx=RFtx−$\omega_{LO}$.

According to the frequency convener in the above-described aspect, the frequency interval between the frequency $\omega_{LO}$ of the local oscillation signal and the lower limit frequency PMlow can be larger than before. As a result, the performance required for the filler circuit to suppress the local oscillation signal mixed in the up-converted transmission signal can be relaxed compared with the conventional one.

In addition, an aspect of the present invention is a frequency converter that up-converts a transmission signal in an intermediate frequency band into a signal in a wireless frequency band as an LSB of a local oscillation signal using the local oscillation signal, in which when a width of a frequency band of the transmission signal is CHwid, a center value of the intermediate frequency band of the transmission signal is IFtx, a center value of a pass bandwidth IFwid of the intermediate frequency band is IFcent, a lower limit frequency of the wireless frequency band is PMlow, and an upper limit frequency of the wireless frequency band is PMhigh, in a case where a center value RFtx of the frequency band of the transmission signal after being up-converted and filtered satisfies PMlow+1/2×IFwid≥RFtx≥PMlow+1/2×CHwid, a frequency $\omega_{LO}$ of the local oscillation signal satisfies $\omega_{LO}$=PMlow+1/2×IFwid+IFcent and IFtx=$\omega_{LO}$−RFtx.

According to the frequency converter in the above-described aspect the frequency interval between the frequency $\omega_{LO}$ of the local oscillation signal and the upper limit frequency PMhigh can be larger than before. As a result, the performance required for the filter circuit to suppress the local oscillation signal mixed in the up-converted transmission signal can be relaxed compared with the conventional one.

In addition, an aspect of the present invention is a wireless device including: the frequency converter according to any one of aspects described above; a signal processor which outputs the transmission signal to the frequency converter; a local oscillator which outputs the local oscillation signal to the frequency converter; an antenna which wirelessly transmits the transmission signal that has been up-converted by the frequency converter and filtered; and a filter circuit which is disposed between the frequency converter and the antenna and suppresses the local oscillation signal included in a signal output from the frequency converter.

Effects of the Invention

According to the above-described aspects of the present invention, a frequency converter or wireless device that can relax the performance required for the filter circuit can be provided.

BRIEF DESCRIPTIONS OF DRAWINGS

BEST MODE FOR CARRYING OUT THE INVENTION

First Embodiment

Figure 1:
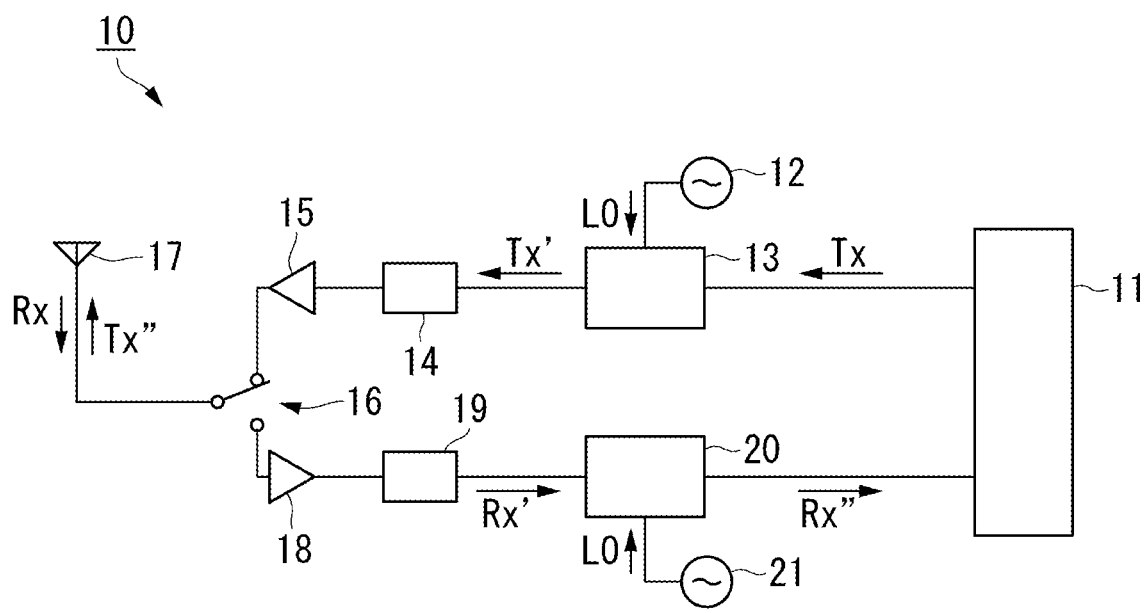
FIG. 1 is a block diagram showing a configuration of a wireless device including a frequency converter according to the first embodiment.

FIG. 1 shows an example of a wireless device 10 including a frequency converter. The wireless device 10 includes at least one of a transmission function and a reception function of a wireless signal. The wireless device 10 is, for example, a cell phone.

The wireless device 10 includes a signal processor 11, a transmission-side local oscillator 12, a transmission-side frequency converter 13, a transmission-side amplifier 15, a switch 16, a transmission-side filter circuit 14, an antenna 17, a reception-side amplifier 18, a reception-side filter circuit 19, a reception-side frequency converter 20, and a reception-side local oscillator 21. The switch 16 is configured to switch between the transmission path and the reception path for the signal path of the wireless device 10.

The signal processor 11 is configured to generate a transmission signal Tx of the so-called intermediate frequency based on the baseband signal. The signal processor 11 is also configured to output the transmission signal Tx of the intermediate frequency to the frequency converter 13. A baseband signal is, for example, an analog signal of voice data collected by a microphone, a digital signal transmitted in data communication, and the like. However, the baseband signal may be any type of signal other than the above.

The frequency of the transmission signal Tx output from the signal processor 11 is lip-converted to a higher frequency (the frequency of the wireless signal) by the frequency converter 13. In the present specification, the transmission signal after up-con version is referred to as the transmission signal Tx'. The local oscillator 12 is connected to the frequency converter 13. The local oscillator 12 outputs the local oscillation signal LO to the frequency converter 13. The local oscillation signal LO is a signal that is multiplied by the frequency converter 13 when performing frequency conversion. In the present specification, the frequency of the local oscillation signal LO is denoted as $\omega_{LO}$. $\omega_{LO}$ is larger than the frequency of the transmission signal Tx output by the signal processor 11.

The frequency converter 13, for example, may be passive or active, and may use diodes or transistors as nonlinear elements, and may also include a multiplier, amplifier, signal distributor, signal synthesizer, and the like inside thereof. The frequency converter 13 up-converts the frequency of the transmission signal Tx using the local oscillator signal LO output from the local oscillator 12 and outputs the signal toward the antenna 17. The signal that the frequency converter 13 outputs toward the antenna 17 includes a portion of the local oscillation signal LO (hereinafter referred to as the leakage signal). The filter circuit 14 is provided to perform filtering and to suppress the leakage signal.

The antenna 17 includes at least one of the transmission function and the reception function of the wireless signal.

When the switch 16 switches the Unction of the wireless device 10 to the transmission side, the up-converted transmission signal Tx' is transmitted wirelessly by the antenna 17 through the filter circuit 14 and the amplifier 15 on the transmission side. When the switch 16 switches the function of the wireless device 10 to the reception side, the wireless signal (reception signal Rx) received by the antenna 17 is output to the frequency converter 20 on the reception side through the reception-side amplifier 18 and the reception-side filter circuit 19. The filter circuit 19 performs wave filtering with respect to the reception signal Rx. The reception-side frequency converter 20 may have a similar configuration to that of the transmission-side frequency converter 13.

The reception-side frequency converter 20 uses the local oscillation signal LO. output by the local oscillator 21 to down-convert the amplified and filtered reception signal Rx' to an intermediate frequency. The local oscillator 12 may also serve as the local oscillator 21. In the present specification, the down-converted reception signal is denoted as a reception signal Rx". The frequency converter 20 outputs the reception signal Rx" to the signal processor 11. The signal processor 11 demodulates the reception signal Rx" and extracts the transmitted data.

Here, the performance required for the filter circuit 14 depends on the frequency interval G between the frequency band of the transmission signal Tx" up-converted, filtered and amplified by the frequency converter 13 and the frequency of the leakage signal (i.e. $\omega_{LO}$). The larger the frequency interval G, the easier it is to suppress the leakage signal, and thus the performance required for the filter circuit 14 can be relaxed. The lower the required performance of the filter circuit 14, the lower the cost and the smaller the size of the wireless device 10 can be.

Figure 2:
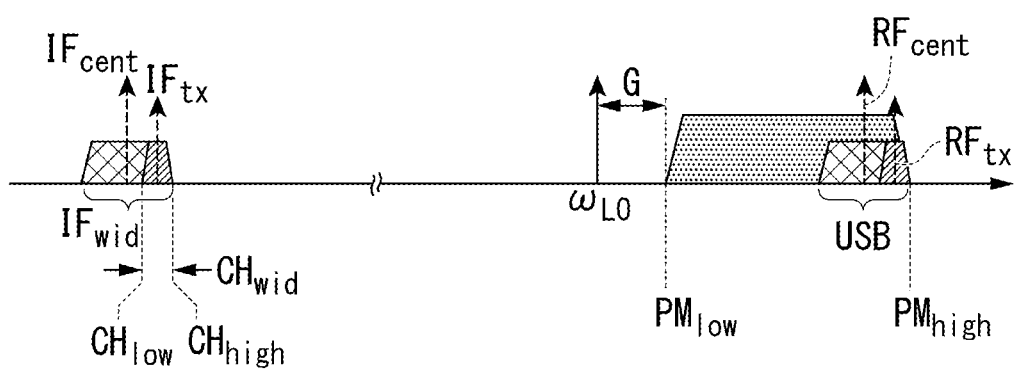
FIG. 2 is a conceptual diagram showing an example of a frequency conversion performed by the frequency converter in FIG. 1.

Therefore, in the present embodiment, a way to increase the frequency interval G is devised. Hereinafter, a more detailed explanation is described using FIG. 2. In FIG. 2, the horizontal axis indicates the frequency, und the higher the frequency toward the right side (the tip of the arrow), the higher the frequency. When the transmission signal Tx of the intermediate frequency band is up-converted using the local oscillator signal LO, two symmetrical side bands (LSB: Lower Side Hand and USB: Upper Side Band) are obtained. The LSB is the frequency band lower than $\omega_{LO}$, and the USB is the frequency band higher than $\omega_{LO}$. In FIG. 2 and the following descriptions, the case where the USB is used to represent the two sidebands is explained, but it is also possible to apply the present embodiment to the case where the LSB is used. The case of using LSB will be described later.

In FIG. 2, IFwid is the width of the intermediate frequency band that can be input and output through the signal processor 11, and is referred to as "passband width IFwid" below IFcent is the center value of the passband width IFwid, and is referred to as "center frequency IFcent" below. CHwid is the width of the frequency band of the transmission signal Tx in the passband width IFwid, and hereinafter referred to as "channel width CHwid". IFtx is the center value of the frequency band of the transmission signal Tx, and is hereinafter referred to as "channel center IFtx". The upper limit frequency of the channel width CHwid is denoted as CHhigh. The lower limit frequency of the channel width CHwid is denoted as CHlow.

In FIG. 2, RFcent is the frequency corresponding to the center frequency IFcent after being up-converted and filtered, and is referred to as "post-converted center frequency RFcent" below. RFtx is the center value of the frequency band of the up-converted, filtered and amplified transmission signal Tx" and is referred to as "post-converted channel center RFtx" below. The post-converted channel center RFtx is also the frequency corresponding to the post-up-convened charnel center IFtx. PMhigh is the upper limit value of the transmittable wireless frequency band specified by the specifications of the wireless device 10, and is hereinafter referred to as "upper limit frequency PMhigh". PMlow is the lower limit value of the transmittable wireless frequency band specified by the specifications of the wireless device 10, and is hereinafter referred to as the "lower limit frequency PMlow".

In a regular wireless communication system, the passband width IFwid is set so that it can cover at least one channel width CHwid. In other words, when n is a natural number greater than or equal to 1, the following formula (1) is satisfied.

$$\text{IFwid} \geq n \times \text{CHwid} \tag{1}$$

In the present embodiment, when the USB is used as the wireless signal for transmission and when the following formula (2) is satisfied, $\omega_{LO}$ and IFtx are set so as to satisfy formulae (3) and (4).

$$\text{PMhigh}-1/2 \times \text{TFwid} \leq \text{RFtx} \leq \text{PMhigh}-1/2 \times \text{CHwid} \tag{2}$$

$$\omega_{LO} = \text{PMhigh}-1/2 \times \text{IFwid}-\text{IFcent} \tag{3}$$

$$\text{IFtx} = \text{RFtx}-\omega_{LO} \tag{4}$$

In the present embodiment, when the LSB is used as the wireless signal for transmission and when the following formula (5) is satisfied, $\omega_{LO}$ and IFtx are set so as to satisfy formulae (6) and (7).

$$\text{PMlow}+1/2 \times \text{IFwid} \geq \text{RFtx} \geq \text{PMlow}+1/2 \times \text{CHwid} \tag{5}$$

$$\omega_{LO} = \text{PMlow}+1/2 \times \text{IFwid}+\text{IFcent} \tag{6}$$

$$\text{IFtx} = \omega_{LOW}-\text{RFtx} \tag{7}$$

Next, effects obtained by employing the present embodiment will be described. In the conventional frequency conversion, the value of $\omega_{LO}$ is set to satisfy the following formula (8) when the USB is used as the transmission signal.

$$\omega_{LO} = \text{RFtx}-\text{IFcent}-\text{PMhigh}-1/2 \times \text{CHwid}-\text{IFcent} \tag{8}$$

When $\omega_{LO}$ is set according to the formula (8) as before, the value of the frequency interval G in FIG. 2 is expressed by the following formula (8)'.

$$G = \text{PMlow}-(\text{PMhigh}-1/2 \times \text{CHwid}-\text{IFcent}) \tag{8'}$$

On the other hand, when $\omega_{LO}$ is set using formula (3), as in the present embodiment, the value of the frequency interval G in FIG. 2 will be the following formula (3)'.

$$G = \text{PMlow}-(\text{PMhigh}-1/2 \times \text{IFwid}-\text{IFcent}) \tag{3'}$$

From formula (1), IFwid becomes a value greater than or equal to CHwid. Therefore, the value of the frequency interval G in formula (3)' is greater than the value of the frequency interval G in formula (8)'. In the present specification, the difference between the value of the frequency interval G in Formula (3)' and the value of the frequency interval G in Formula (8)' is denoted as ΔG. The magnitude of ΔG can be obtained from formula (9).

$$\Delta G = 1/2 \times (\text{IFwid}-\text{CHwid}) \tag{9}$$

Substituting formula (1) into formula (9), formula (9)' can be obtained.

$$\Delta G \geq 1/2 \times (n-1) \times \text{CHwid} \tag{9'}$$

In formula (9)', n is a natural number greater than or equal to 1. For this reason, the value of ΔG is greater than zero. The value of ΔG shows how much larger the frequency interval G is in the present embodiment compared to the conventional one. As described above, the larger the frequency interval G, the more the performance required for the filter circuit 14 can be relaxed. Since the value of ΔG is larger for wireless systems with larger values of n, the application of the present embodiment will have a more pronounced effect.

Although the detailed explanation is omitted, an effect similar to the above can be obtained when the transmission signal Tx is up-converted as LSB using the local oscillation signal LO.

As described above, the frequency converter 13 of the present embodiment may up-convert the transmission signal Tx in the intermediate frequency band to a signal in the wireless frequency band as the USB of the local oscillation signal LO using the local oscillation signal LO. When the width of the frequency band of the transmission signal Tx is CHwid, the center value of the frequency band of the transmission signal Tx is IFtx. the center value of the passband width of the intermediate frequency band TFwid is IFcent, the lower limit frequency of the wireless frequency band is PMlow, and the upper limit frequency of the wireless frequency band is PMhigh, the frequency converter 13 is configured such that the frequency $\omega_{LO}$ of the local oscillation signal LO satisfies $\omega_{LO}=\text{PMhigh}-1/2 \times \text{IFwid}-\text{IFcent}$ and $\text{IFtx}=\text{RFtx}-\omega_{LO}$ when the center value RFtx of the frequency hand of the transmission signal Tx" filtered and amplified after up-con version satisfies $\text{PMhigh}-1/2 \times \text{IFwid} \leq \text{RFtx} \leq \text{PMhigh}-1/2 \times \text{CHwid}$.

According to the frequency convener 13 of the above-mentioned configuration, the frequency interval G between the frequency $\omega_{LO}$ of the local oscillation signal LO and the lower limit frequency PMlow can be larger than before. As a result, the performance required for the filter circuit 14, which suppresses the local oscillation signal LO mixed in the up-converted transmission signal Tx', can be more relaxed compared to the conventional one.

In addition, the frequency converter 13 of the present embodiment may up-convert the transmission signal Tx in the intermediate frequency band to a signal in the wireless frequency band as the LSB of the local oscillation signal LO using the local oscillation signal LO. In such a case, the frequency converter 13 is configured such that the frequency $\omega_{LO}$ of the local oscillation signal LO satisfies $\omega_{LO}=\text{PMlow}+1/2 \times \text{IFwid}+\text{IFcent}$ and $\text{IFtx}=\omega_{LO}-\text{RFtx}$ when the center value RFtx of the frequency band of the transmission signal Tx" filtered and amplified after up-conversion satisfies $\text{PMlow}+1/2 \times \text{IFwid} \geq \text{RFtx} \geq \text{PMlow}+1/2 \times \text{CHwid}$.

According to the frequency converter 13 of the above-mentioned configuration, the frequency interval between the frequency $\omega_{LO}$ of the local oscillation signal LO and the upper limit frequency PMhigh can be larger than before. As a result, the performance required for the filter circuit 14, which suppresses the local oscillation signal LO mixed in the up-converted transmission signal Tx', can be more relaxed compared to the conventional one.

In addition, the wireless device 10 of the present embodiment includes a frequency converter 13, a signal processor 11 that outputs a transmission signal Tx to the frequency converter 13, a local oscillator 12 that outputs a local oscillation signal LO to the frequency converter 13, an antenna 17 that wirelessly transmits the transmission signal Tx" filtered and amplified after up-conversion by the frequency converter 13, and a filter circuit 14 that is arranged between the frequency converter 13 and the antenna 17 and suppresses the local oscillation signal LO included in the signal output from the frequency converter 13.

According to the wireless device 10 of the above configuration, the performance required for the filter circuit 14 is more relaxed compared to the conventional one. Therefore, the size and cost of the wireless device 10 as a whole can be reduced.

Second Embodiment

Next, the second embodiment of the present invention will be described. The basic configuration is similar to the first embodiment. For this reason, the same reference symbol is attached to the same configuration and the description thereof is omitted, and only the differences are described.

The present embodiment differs from the first embodiment in that it focuses on the reception-side frequency converter 20.

As described in the first embodiment the reception-side frequency converter 20 down-converts the wireless signal (reception signal Rx'), which is input from the antenna 17, amplified and wave-filtered, loan intermediate frequency signal (reception signal Rx"). At this time, the frequency converter 20 uses die local oscillation signal LO input from the reception-side local oscillator 21. In FIG. 1, the transmission-side local oscillator 12 and the reception-side local oscillator 21 are arranged separately. However, the same local oscillator may be used for the transmission-side frequency converter 13 and the reception-side frequency converter 20. In this case, the same local oscillator is connected to the frequency converter 13 and the frequency converter 20.

In the down-converted reception signal Rx", the image signal in the section symmetrically folding a section from the lower limit frequency PM low to the upper limit frequency PM high with respect to the frequency $\omega_{LO}$ of the local oscillation signal LO is mixed in as a signal component of the same frequency. Therefore, a filter circuit 19 that suppresses die mixed image signals is provided between the amplifier 18 and the frequency converter 20. In order to alleviate the performance required for the filter circuit 19, the frequency converter 20 of the present embodiment is configured as follows.

The frequency converter 20 of the present embodiment converts the reception signal Rx' in the wireless frequency band to a signal in the intermediate frequency band as the USB of the local oscillation signal LO using the local oscillation signal LO. The reception signal Rx' may be down-converted, the width of the frequency band of the receipt ion signal Rx is CHwid, the center value of the frequency band of the reception signal Rx is RFrx, the center value of the passband width IFwid of the intermediate frequency band is IFcent, and the frequency of the local oscillation signal LO is $\omega_{LO}$. When the lower limit frequency of the wireless frequency band is set to PMlow and the upper limit frequency of the wireless frequency band is set to PMhigh, the frequency converter 20 is configured such that the frequency $\omega_{LO}$ of the local oscillation signal LO satisfied $\omega_{LO}$=PMhigh−1/2×IFwid−IFcent and IFrx=RFrx−$\omega_{LO}$ when the center value RFrx of the frequency hand of the reception signal Rx' satisfies PMhigh−1/2×IFwid≤RFrx≤PMhigh−1/2×CHwid.

According to the frequency convener 20 with the above configuration, the frequency interval between the section where the image signal exists (PMlow to PMhigh folded symmetrically with respect to $\omega_{LO}$) and the section where the reception signal exists (PMlow to PMhigh) can be larger than before. This makes it possible to relax the performance requirements of the filler circuit that suppresses the image signal. The performance required for the filler circuit to suppress the image signal can be more relaxed compared to conventional circuits.

In addition, the frequency converter 20 of the present embodiment converts the reception signal Rx: in the wireless frequency band to a signal in the intermediate frequency band as the LSB of the local oscillation signal LO using the local oscillation signal LO. The reception signal Rx' may be down-converted. In this case, the frequency converter 20 is configured such that $\omega_{LO}$=PMlow+1/2×IFwid+IFcent and IFrx=$\omega_{LO}$−RFrx when the center value RFrx of the frequency band of the reception signal Rx' satisfies PMlow+112×IFwid≥RFrx≥PMlow+1/2×CHwid.

According to the frequency converter 20 with the above configuration, the frequency interval between the frequency $\omega_{LO}$ of the local oscillation signal LO and the upper limit frequency PMhigh can be larger than before. As a result, the performance required for the filter circuit to suppress the local oscillation signal LO mixed in the down-converted reception signal Rx' can be relaxed compared to the conventional filler circuit.

The technical scope of the present invention is not limited to the above-mentioned embodiments, and various changes can be made without departing from the purpose of the present invention.

For example, the wireless device 10 may be equipped with a configuration not shown in FIG. 1.

In addition, the components in the above embodiments may be replaced with well-known components without departing from the purpose of the present invention, and it may also be possible to combine the above embodiments and variations thereof in an appropriate manner.

For example, within the same wireless device 10, the frequency converter 13 on the transmission side may perform the processing described in the first embodiment and the frequency converter 20 on the reception side may perform the processing described in the second embodiment.

DESCRIPTION OF THE REFERENCE SYMBOLS

10: Wireless device
11: Signal processor
12: Local oscillator (transmission side)
13: Frequency converter (transmission side)
14: Filter circuit
17: Antenna
20: Frequency converter (reception side)
21: Local oscillator (reception side)
IFwid: Passband width
LO: Local oscillation signal
$\omega_{LO}$: Frequency of local oscillation signal
PMlow: Lower limit frequency
PMhigh: Upper limit frequency
Tx: Transmission signal
Tx': Transmission signal (after up-conversion)

The invention claimed is:

1. A frequency converter that up-converts a transmission signal in an intermediate frequency band into a signal in a wireless frequency band as an upper side band of a local oscillation signal using the local oscillation signal, wherein
when a width of a frequency band of the transmission signal is CHwid,
a center value of the frequency band of the transmission signal is IFtx,
a center value of a passband width IFwid of the intermediate frequency band is IFcent,
a lower limit frequency of the wireless frequency band is PMlow, and
an upper limit frequency of the wireless frequency band is PMhigh,
in a case where a center value RFtx of the frequency band of the transmission signal after being up-converted satisfies PMhigh−1/2×IFwid ≤RFtx ≤PMhigh−1/2×CHwid, a frequency $\omega_{LO}$ of the local oscillation signal satisfies $\omega_{LO}$=PMhigh−1/2×IFwid-IFcent and IFtx=RFtx−$\omega_{Lo}$.

2. A wireless device comprising:

the frequency converter according to claim 1;

a signal processor which outputs the transmission signal to the frequency converter;

a local oscillator which outputs the local oscillation signal to the frequency converter;

an antenna which wirelessly transmits the transmission signal that has been up-converted by the frequency converter and filtered; and a filter circuit which is disposed between the frequency converter and the antenna and suppresses the local oscillation signal included in a signal output from the frequency converter.

3. A frequency converter that up-converts a transmission signal in an intermediate frequency band into a signal in a wireless frequency band as a lower side band of a local oscillation signal using the local oscillation signal, wherein when a width of a frequency band of the transmission signal is CHwid, a center value of the frequency band of the transmission signal is IFtx, a center value of a passband width IFwid of the intermediate frequency band is IFcent, a lower limit frequency of the wireless frequency band is PMlow, and an upper limit frequency of the wireless frequency band is PMhigh, in a case where a center value RFtx of the frequency band of the transmission signal after being up-converted satisfies PMlow+1/2×IFwid≥RFtx≥PMlow+1/2×CHwid, a frequency $\omega_{LO}$ of the local oscillation signal satisfies $\omega_{LO}$=PMlow+1/2×IFwid+IFcent and IFtx=$\omega_{LO}$−RFtx.

4. A wireless device comprising:

the frequency converter according to claim 3;

a signal processor which outputs the transmission signal to the frequency converter;

a local oscillator which outputs the local oscillation signal to the frequency converter;

an antenna which wirelessly transmits the transmission signal that has been up-converted by the frequency converter and filtered; and a filter circuit which is disposed between the frequency converter and the antenna and suppresses the local oscillation signal included in a signal output from the frequency converter.

\* \* \* \* \*